United States Patent
Delaet et al.

(10) Patent No.: US 10,643,788 B2
(45) Date of Patent: May 5, 2020

(54) PERMANENT MAGNET COMPRISING A STACK OF N PATTERNS

(71) Applicant: Commissariat a l'energie atomique et aux energies alternatives, Paris (FR)

(72) Inventors: Bertrand Delaet, Bernin (FR); Sophie Giroud, Saint-Egreve (FR); Rachid Hida, Cras (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 273 days.

(21) Appl. No.: 15/654,115

(22) Filed: Jul. 19, 2017

(65) Prior Publication Data
US 2018/0025840 A1    Jan. 25, 2018

(30) Foreign Application Priority Data
Jul. 20, 2016   (FR) .................................. 16 56928

(51) Int. Cl.
*H01F 41/02* (2006.01)
*G01R 33/038* (2006.01)
(Continued)

(52) U.S. Cl.
CPC ..... *H01F 41/0253* (2013.01); *G01R 33/0052* (2013.01); *G01R 33/0286* (2013.01);
(Continued)

(58) Field of Classification Search
None
See application file for complete search history.

(56) References Cited

U.S. PATENT DOCUMENTS 4,103,315 A * 7/1978 Hempstead ............ B82Y 25/00
257/E43.004
6,462,641 B1  10/2002 Dieny et al.
(Continued)

FOREIGN PATENT DOCUMENTS

FR   2 774 774 A1   8/1999
FR   2 929 464 A1   10/2009
(Continued)

OTHER PUBLICATIONS

French Preliminary Search Report dated Apr. 11, 2017 in French Application 16 56928 filed on Jul. 20, 2016 (with English Translation of Categories of cited documents and Written Opinion).
(Continued)

*Primary Examiner* — Kevin M Bernatz
(74) *Attorney, Agent, or Firm* — Oblon, McClelland, Maier & Neustadt, L.L.P.

(57) ABSTRACT

A permanent magnet including, at least once per group of ten consecutive ferromagnetic layers, a growth layer directly interposed between a top antiferromagnetic layer of a previous pattern and a bottom antiferromagnetic layer of a following pattern. This growth layer is entirely realized in a nonmagnetic material chosen from the group made up of the following metals: Ta, Cu, Ru, V, Mo, Hf, Mg, NiCr and NiFeCr, or it is realized by a stack of several sublayers of nonmagnetic material disposed immediately on one another, at least one of these sublayers being entirely realized in a material chosen from the group. The thickness of the growth layer is greater than 0.5 nm.

12 Claims, 2 Drawing Sheets

(51) Int. Cl.
  *H01F 10/30* (2006.01)
  *G01R 33/00* (2006.01)
  *H01F 41/30* (2006.01)
  *G01R 33/028* (2006.01)
  *H01F 1/00* (2006.01)
  *H01F 10/32* (2006.01)
  *H01F 7/02* (2006.01)

(52) U.S. Cl.
  CPC ......... *G01R 33/038* (2013.01); *H01F 1/0009* (2013.01); *H01F 10/30* (2013.01); *H01F 10/3218* (2013.01); *H01F 10/3272* (2013.01); *H01F 41/30* (2013.01); *H01F 41/304* (2013.01); *H01F 7/021* (2013.01)

(56) References Cited

U.S. PATENT DOCUMENTS

| | | | | |
|---|---|---|---|---|
| 6,713,800 | B2* | 3/2004 | Chen | G11B 5/3903 257/294 |
| 8,659,853 | B2* | 2/2014 | Han | B82Y 10/00 360/314 |
| 2003/0197984 | A1* | 10/2003 | Inomata | B82Y 10/00 360/324.2 |
| 2009/0015252 | A1* | 1/2009 | Raberg | B82Y 25/00 324/252 |
| 2009/0289747 | A1 | 11/2009 | Duraffourg et al. | |
| 2011/0151589 | A1* | 6/2011 | Redon | B82Y 25/00 438/3 |
| 2011/0304325 | A1 | 12/2011 | Walther et al. | |
| 2012/0225322 | A1 | 9/2012 | Han et al. | |
| 2017/0053724 | A1* | 2/2017 | Delaet | G01R 33/0286 |
| 2017/0294253 | A1* | 10/2017 | Delaet | G01R 33/038 |

FOREIGN PATENT DOCUMENTS

| | | |
|---|---|---|
| FR | 3 020 497 A1 | 10/2015 |
| WO | WO 2010/084165 A1 | 7/2010 |
| WO | WO 2011/028185 A1 | 3/2011 |

OTHER PUBLICATIONS

M. Pakala, et al. "Effect of underlayer roughness, grain size, and crystal texture on exchange coupled IrMn/CoFe thin films", Journal of Applied Physics, vol. 87, No. 9, 2000, 4 pages.

W.-Y. Lee, et al. "High magnetoresistance permalloy films deposited on a thin NiFeCr or NiCr underlayer", Journal of Applied Physics, vol. 87, No. 9, 2000, 4 pages.

Kojiro Yagami, et al. "Enhancement of exchange bias in Mn—Ir/Co—Fe based spin valves with an ultrathin Cu underlayer and in situ Mn—Ir surface modification", Journal of Applied Physics, vol. 89, No. 11, 2001, 4 pages.

* cited by examiner

PERMANENT MAGNET COMPRISING A STACK OF N PATTERNS

The invention concerns a permanent magnet as well as a magnetic field sensor incorporating this permanent magnet. The invention likewise concerns a method of fabrication of this permanent magnet.

Known magnetic field sensors incorporate permanent magnets in order to measure the amplitude, in a given direction, of a magnetic field to be measured. Such sensors are described, for example, with reference to FIG. 4 of the application US2011/0151589 or with reference to FIGS. 1A to 8 of the application WO2010/0084165.

The permanent magnets used in these sensors, unlike the pinned layers used in spin valves or GMR (Giant Magnetoresistance) valves and in TMR (Tunnel Magnetoresistance) or tunnel junctions, need to generate a significant magnetic field. Keep in mind that, in spin valves and tunnel junctions, the magnetic field generated by the pinned layer on the contrary needs to be weak in order to allow the direction of magnetization of the free layer to rotate and align itself with the direction of an outside magnetic field. Thus, in the case of dynamic structures, such as MRAM (Magnetoresistive Random Access Memory) structures, for example, the magnetization evolves during the use of the structure. On the other hand, in permanent magnets the direction of magnetization is frozen.

In order to obtain a significant magnetic field, in the known sensors, the permanent magnet is realized by a stack of ferromagnetic layers and antiferromagnetic layers. Typically, such a permanent magnet comprises a stack of N patterns stacked one on top of another in a stack direction, where N is a whole number greater than or equal to two, each pattern comprising:
- a bottom antiferromagnetic layer,
- a top antiferromagnetic layer, and
- a ferromagnetic layer situated between the bottom and top antiferromagnetic layers and whose direction of magnetization is frozen, by an exchange coupling, with the bottom or top antiferromagnetic layer of this pattern, the directions of magnetization of the ferromagnetic layers which are coupled by exchange coupling with the bottom or top antiferromagnetic layer of the same pattern being all identical to each other.

In the known permanent magnets, each ferromagnetic layer is wedged between two antiferromagnetic layers. Such embodiments of a permanent magnet are described with reference to FIG. 1A of the application US 2011/0151589 and with reference to FIGS. 10A and 10B of the application WO 2010/0084165.

In this description, when it says that a layer or a sublayer is "realized in X" or when one speaks of an "X layer" or a "layer in X", this denotes a layer or a sublayer in which the material X represents more than 95% of its mass and generally more than 98% or 99% of its mass.

By ferromagnetic and antiferromagnetic layers is meant layers realized respectively in ferromagnetic material and in antiferromagnetic material.

In the following, the magnetic field of a permanent magnet comprising a stack of ferromagnetic and antiferromagnetic layers is considered to be significant if the total magnetic moment of this magnet per unit of surface is greater than $50 \times 10^{-3}$ A and preferably greater than $500 \times 10^{-3}$ A or $1000 \times 10^{-3}$ A.

The magnetic moment per unit of surface of a permanent magnet comprising a stack of ferromagnetic and antiferromagnetic layers can easily be measured. For example, the magnetic moment of the permanent magnet is measured by the VSM method (Vibrating Sample Magnetometry). This method is well known. For example, it is described in the following articles:
- Simon FONER, "Versatile and Sensitive Vibrating-Sample Magnetometer", The review of scientific instruments, Volume 30, number 7, July 1959,
- Christian Albrechts, "Vibrating Sample Magnetometry", University of Kiel, M106, 2011.

The magnetic moment so measured is then divided by the volume of ferromagnetic material contained in this magnet in order to obtain its magnetization. Regardless of the stack, the dimensions of the ferromagnetic layers can be easily measured, for example, by observation of vertical sections of this stack with a microscope. In particular, these observations make it possible to measure the thickness t of each ferromagnetic layer. Finally, the magnetization so obtained is multiplied by the sum of the thicknesses $t_i$ of each ferromagnetic layer to obtain the magnetic moment of that magnet per unit of surface. Generally, the ferromagnetic layers of the stack all have the same surface in a plane perpendicular to the stack direction of these layers. Consequently, one may also divide the magnetic moment measured for the magnet by the surface of the ferromagnetic layers, or by the surface of the permanent magnet if it is equal to the surface of the ferromagnetic layers, to obtain the magnetic moment per unit of surface.

The magnetization of such a permanent magnet typically presents a hysteresis cycle such as the one shown in FIG. 1.

FIG. 1 shall now be used to define certain terms. The curve 2 represents in schematic fashion the evolution of the magnetization, denoted as B in the figures, of the permanent magnet as a function of the magnetic field H. More precisely, the magnetization B varies between two extreme values $B_{SL}$ and $B_{SH}$. When the magnetization of the permanent magnet approaches the value $B_{SH}$, its magnetization no longer increases significantly even if the magnetic field H increases. In order to simplify FIG. 1, this insignificant increase in the magnetization B as a function of the field H has been represented by a horizontal line. It is then said that the magnet is saturated. The same phenomenon occurs when the magnetization approaches the value $B_{SL}$ and that the magnetic field continues to decrease. Between these two extreme values, the curve 2 defines a hysteresis cycle 4. The cycle 4 comprises:
- a curve 4A that descends as the magnetic field H decreases, and
- a curve 4B that ascends as the magnetic field H increases.

The curves 4A and 4B meet on the one side near a point 4C and on the other side near a point 4D. Between these points 4C and 4D, the curves 4A and 4B are distinct from one another. Beyond the point 4C and before reaching the point 4D, the curves 4A and 4B are substantially merged and for significant fields in absolute value there is a tendency toward saturation. Here, the point 4C is the closest to the ordinate axis.

In the area of points 4C and 4D, the spacing between the curves 4A and 4B is equal to 2% of the value $B_R$, $B_R$ corresponding to the zero field magnetization (that is, for the field H=0). In FIG. 1, owing to the simplification of the curve in the area of the saturation, $B_R$ corresponds to $B_{SH}$.

In the case of permanent magnets formed by the stack of ferromagnetic and antiferromagnetic layers, the hysteresis cycle 4 is generally staggered, for example as represented in FIG. 1. More precisely, the cycle 4 is staggered with regard to the ordinate axis by a value $H_{ex}$ termed hereafter the exchange field $H_{ex}$ or field $H_{ex}$. This field $H_{ex}$ is also known as the "exchange bias". Typically, the value of the field $H_{ex}$ corresponds to the value of the abscissa of the point situated midway between the two points where the cycle 4 intersects the abscissa axis. In this graph, the abscissa axis represents the magnetic field H.

The coercive field $H_c$ or field $H_c$ of the permanent magnet is the half-width of the cycle 4. Typically, its value is taken equal to the difference between the value of the field $H_{ex}$ and a point of intersection of the cycle 4 with the abscissa axis.

The field H* is likewise defined as being the smallest magnetic field after which the hysteresis of the permanent magnet vanishes, that is, as specified above, the magnetic field for which the hysteresis is less than 2% of the value $B_R$. Here, the value of the field H* is equal to the value of the abscissa of the point 4C.

It is desirable for the magnet to have a field H* as far away from the ordinate axis as possible. In fact, this improves the insensitivity of this magnet to exterior magnetic perturbations. This also allows for improved dynamics of the magnetic field sensors incorporating such magnets. In this context, it is said that the field H* is improved when it moves further away from the ordinate axis. On the other hand, it is said that the field H* deteriorates if it approaches the ordinate axis. This field H* depends on the fields $H_{ex}$, $H_c$ and on the shape of the cycle which can be approximated by a parameter known as the "squareness", which is defined in further detail below and which is a function of the materials and methods used.

It is also necessary for the magnet to generate a significant magnetic field. The magnetic field generated by the magnet increases as a function of the number N of patterns of the stack. It is thus desirable to increase this number N. Now, it has been observed that the more the number N increases, the more the field H* deteriorates. Thus, a contradiction exists between:

on the one hand, the need to increase the number N of patterns to generate a more significant magnetic field, and on the other hand, the need to limit the number N of patterns to keep a field H* as far as possible away from the ordinate axis.

The prior art is also known from: WO2011/028185A1 and FR2774774A1.

The invention proposes to remedy this contradiction and to obtain a permanent magnet which, for a same number N of patterns, has a field H* further away from the ordinate axis. For this purpose, the invention concerns a permanent magnet according to claim 1.

Growth layer is intended to mean a layer having on its surface a roughness and a lattice parameter adapted to the growth of the bottom antiferromagnetic layer of the following pattern. It has been discovered that the introduction of a growth layer of nonmagnetic material between the antiferromagnetic layers of two successive patterns made it possible to improve the field H* as compared to an identical magnet lacking such growth layers. One of the hypotheses to explain the results observed is that the growth layer would have an influence on the roughness of the interface between the antiferromagnetic and ferromagnetic layers situated just above it and thus it would improve the exchange coupling between these antiferromagnetic and ferromagnetic layers, as well as the coercive field $H_c$ and the "squareness", hence improving the field H*.

The growth layer may have a structure similar to the layer known as the "seed layer". The seed layer is always situated beneath the stack. In fact, it is used to create conditions favourable to the growth of the following layers of the stack.

On the other hand, such a seed layer is never introduced between two successive patterns of the stack. In fact, once the conditions favourable to the growth of the following layers have been created by the seed layer, there is no reason to introduce an additional seed layer in the stack, since the conditions for growth of the layers are already favourable. On the contrary, the person skilled in the art knows that adding additional layers to the stack makes its fabrication more complex, so that he is not encouraged to add such additional layers unless he sees an advantage to this.

The inventors have discovered that if one remains at a limited total volume of growth layers, that is, typically less than 25% of the total volume of the stack, the improvement in the field H* largely outweighs the increased complexity of the fabrication process caused by the adding of growth layers.

Finally, it is emphasized that the seed layer is placed beneath the stack of an antiferromagnetic layer and a ferromagnetic layer. Thus, if the skilled person wanted to introduce a seed layer in the stacks of patterns as described in the applications US2011/0151589 and WO2010/0084165, he would then obtain a stack in which the seed layer is situated beneath the antiferromagnetic layer of the next pattern and on the ferromagnetic layer of the previous pattern. Now, a magnet comprising such a stack does not have the advantages of the magnet claimed.

The embodiments of this permanent magnet may comprise one or more of the features of the dependent claims.

These embodiments of the permanent magnet furthermore present the following advantages:

The fact that the growth layer contains tantalum allows it to also perform the barrier function able to limit the diffusion of manganese. This allows further improvement of the field H*.

The fact that the growth layer contains a metallic sublayer in direct contact with the antiferromagnetic layer of the next pattern allows further improvement of the field H*.

The greater the number of growth layers in the stack, the more the field H* is improved.

The use of a RKKY coupling in one pattern of the magnet makes it possible to trap the direction of magnetization of a ferromagnetic layer without using an additional antiferromagnetic layer. This allows further improvement of the field H*.

The introduction of a sublayer of CoFeB within the ferromagnetic layer also allows further improvement of the field H*.

The invention also concerns a magnetic field sensor according to claim 11.

Finally, the invention also concerns a method for fabrication of the permanent magnet claimed according to claim 12.

The invention will be better understood upon perusal of the following description, given solely as a nonlimiting example, while referring to the drawings, in which FIG. 1 is a schematic illustration of the hysteresis cycle of a permanent magnet made from a stack of ferromagnetic and antiferromagnetic layers;

In these figures, the same references are used to denote the same elements. In the remainder of this description, the features and functions well known to the skilled person are not described in detail.

Figure 2:
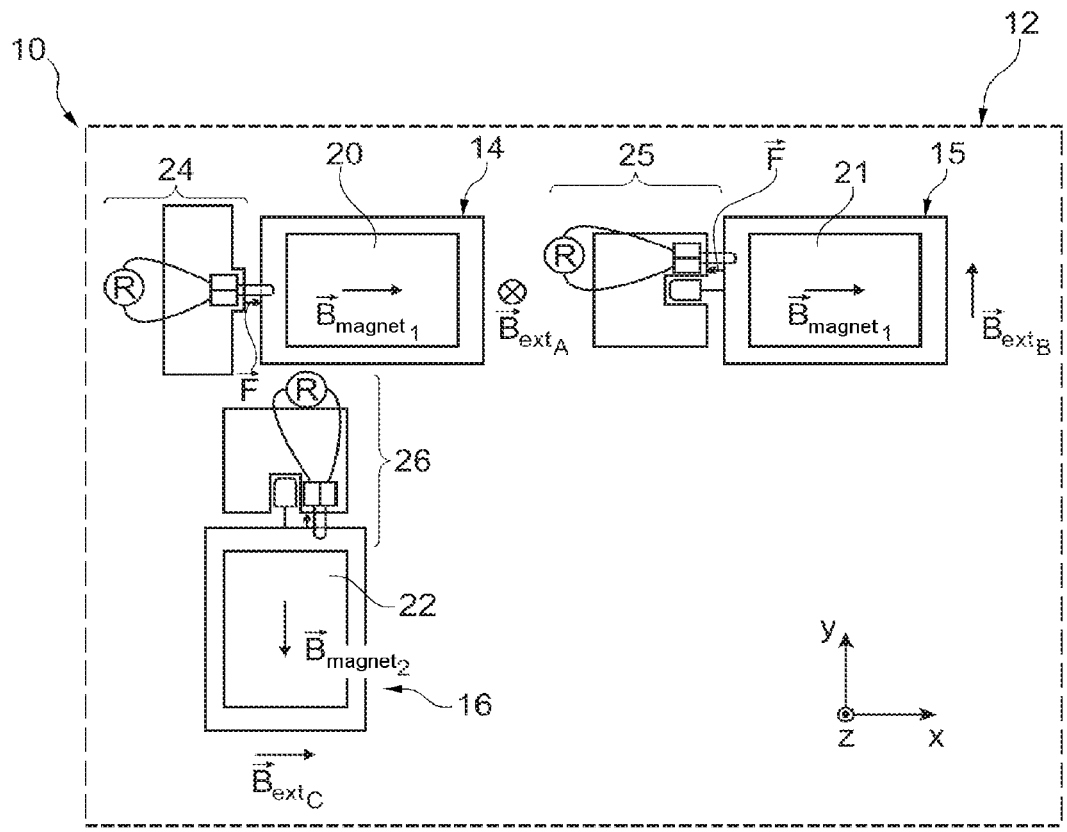
FIG. 2 is a schematic illustration, in top view, of a magnetic field sensor.

FIG. 2 represents a magnetic field sensor 10. This sensor 10 is identical to the sensor described with reference to FIG. 8 of the application WO2010/084165, except as regards the structure of the permanent magnets used. Thus, only a brief description of the general architecture of this sensor is given to illustrate a sample embodiment of such a sensor.

This sensor 10 comprises:
a substrate 12 extending substantially in a horizontal plane parallel to the orthogonal X and Y directions, and
three uniaxial magnetometers 14 to 16 realized on the substrate 12.

A direction Z, perpendicular to the directions X and Y, represents the vertical. Henceforth, the following figures are oriented with respect to this same reference system X, Y, Z. Moreover, the terms such as "above", "below", "on bottom", "on top", are defined in relation to this direction Z.

The magnetometers 14 to 16 measure the amplitude of the magnetic field to be measured in the directions Z, Y and X, respectively. For this purpose, each magnetometer 14 to 16 comprises:
a permanent magnet, respectively 20 to 22, able to be moved in relation to the substrate 12, and
a transducer, respectively 24 to 26, able to transform the displacement of the permanent magnet into a corresponding variation in current or voltage.

For example, the transducers 24 to 26 are piezoresistive transducers. Typically, these transducers are fixed, with no degree of freedom, on one side to the substrate 12, and on the other side to the permanent magnet.

Here, the permanent magnets 20 to 22 are identical, except for the fact that the direction of the overall magnetic moment of the permanent magnet 22 is perpendicular to that of the permanent magnets 20 and 21. Hence, only a detailed description of the permanent magnet 20 is given below.

Figure 3:
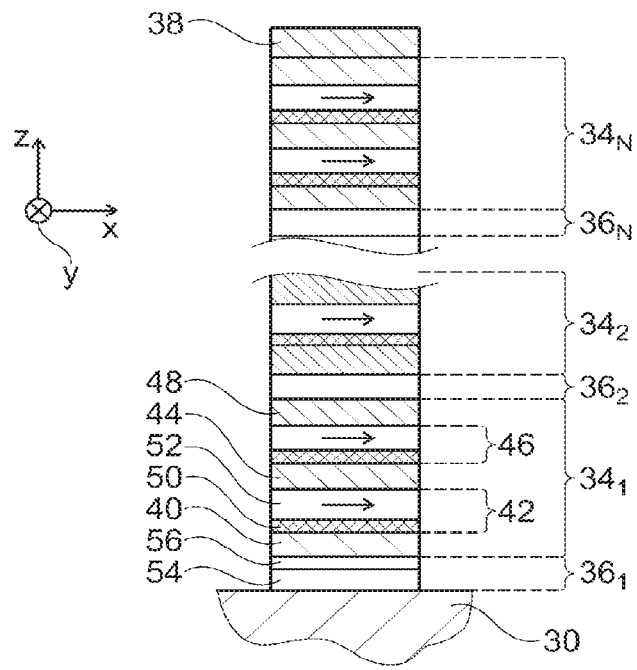
FIG. 3 is a schematic illustration, in vertical longitudinal section, of a permanent magnet of the sensor of FIG. 2.

FIG. 3 shows the permanent magnet 20 deposited on a base 30 able to move relative to the substrate 12. For example, the base 30 is obtained by etching of the substrate 12. Only a portion of this base 30 is shown in FIG. 3.

The magnet 20 is formed by a stack, in a stack direction, of ferromagnetic and antiferromagnetic layers. Here, the stack direction is parallel to the direction Z. In FIG. 3 and the following figures, the following conventions are adopted:
the antiferromagnetic layers are shown by hatching,
the direction of the magnetic moment of a ferromagnetic layer is represented by an arrow,
the wavy lines in the middle of the stack indicate that an intermediate portion of that stack has not been shown,
the proportions between the thicknesses of different layers are not respected, for better understanding of the figures, and
the proportion between the length L and the height of the stack is not respected in order to reduce the size of the figures in the longitudinal direction of the stack.

Here, the stack has a parallelepiped shape and a form factor greater than or equal to 2, 5 or 20, or even greater than 100 or 1000. In this embodiment, the form factor is defined as being the ratio of the length L to the width W of the stack. Here, the length is parallel to the direction X and the width W is parallel to the direction Y.

The larger the form factor, the easier to align the direction of magnetization of the ferromagnetic layers with the longitudinal direction of the stack during its fabrication. For example, the width of the stack is less than 20 µm or 10 µm and the length L is greater than 50 µm or 100 µm or 1 mm. The height of the stack is generally greater than 100 µm or 500 µm. This height is measured between the layer of the stack closest to the base 30 and the layer of this same stack furthest away from the base 30.

Here, the stack of ferromagnetic and antiferromagnetic layers is composed of:
a pattern 34 repeated N times,
a growth layer 36 situated just beneath each pattern 34,
an encapsulation layer 38 deposited at the top of this stack.

The layer 38 is designed to protect the permanent magnet against chemical and/or physical aggression from the outside environment. This layer 38 is realized in a nonmagnetic material. By nonmagnetic material is meant here a material lacking a magnetic property able to perturb the functioning of the permanent magnet 20. Generally, this involves a material whose magnetic properties are null or not measurable.

Typically, the layer 38 is realized in tantalum (Ta) or in molybdenum (Mo) or in ruthenium (Ru) or a combination of these materials. For example, the layer 38 is realized in tantalum (Ta) and its thickness is greater than or equal to 10 nm.

In this embodiment, the stack direction of the patterns 34 is parallel and in the same direction as the direction Z. The first occurrences of the pattern 34 and of the growth layer 36 in the stack, that is, those which are closest to the base 30, are given respectively the numerical references $34_1$ and $36_1$. The second occurrences of the pattern 34 and of the layer 36 immediately above these first occurrences $34_1$ and $36_1$ bear the references $34_2$ and $36_2$, and so on up to the last occurrences $34_N$ and $36_N$.

Here, each occurrence $34_1$ to $34_N$ is directly stacked on a respective occurrence of the layer 36. In particular, two consecutive occurrences of the pattern 34 in the direction Z are systematically separated from each other solely by a single occurrence of the layer 36. In this embodiment, the first occurrence $36_1$ of the layer 36 is used as a seed layer.

The number N of repetitions of the pattern 34 is generally chosen to achieve a desired height of the stack. This height depends on the application in view. However, N is systematically greater than or equal to two, and preferably greater than 5 or 10 or 20. N is also generally less than 50 or 100. Here, N is likewise chosen so as to achieve the desired magnetic moment per unit of surface for the permanent magnet.

In this embodiment, the different occurrences of the pattern 34 are all identical to each other and only the occurrence $34_1$ shall thus be described in detail.

Here, as an illustration, the occurrence $34_1$ is composed successively in the direction Z:
of an antiferromagnetic layer 40,
of a ferromagnetic layer 42 whose direction of magnetization is trapped by exchange coupling with the antiferromagnetic layer 40,
of an antiferromagnetic layer 44 which also traps, by exchange coupling, the direction of magnetization of the ferromagnetic layer 42,
of a ferromagnetic layer 46 whose direction of magnetization is also trapped by exchange coupling with the antiferromagnetic layer 44, and of an antiferromagnetic layer 48 which also traps, by exchange coupling, the direction of magnetization of the ferromagnetic layer 46.

In this sample embodiment, the antiferromagnetic layers 44 and 46 are identical to the antiferromagnetic layer 40. Likewise, the ferromagnetic layer 46 is identical to the ferromagnetic layer 42. Thus, in the following, only the layers 40 and 42 are described in further detail.

In this application, by "antiferromagnetic" layer is meant a horizontal layer of constant thickness in which the antiferromagnetic material(s) represent more than 95% or 98% or 99% of the mass of this layer.

The antiferromagnetic materials used are for example chosen from the group made up of:
manganese alloys,
NiO, and
$Fe_2O_3$.

The antiferromagnetic manganese alloys are typically PtMn, NiMn, PdPtMn, FeMn and IrMn. In this example, the antiferromagnetic material chosen for the layer 40 is the alloy IrMn.

In this application, by "ferromagnetic" layer is meant a horizontal layer of constant thickness in which the ferromagnetic material(s) represent more than 95% or 98% or 99% of the mass of this layer.

The ferromagnetic materials used are chosen for example from the group made up of:
alloys based on Fe and/or Co and/or Ni, such as CoFe, NiFe, CoFeSi, etc., and
Heusler alloys such as $Cu_2MnSn$ or $Co_2MnSi$ or $Ni_2MnAl$ ect.

In this embodiment, the direction of magnetization of the layer 42, that is, the direction of its magnetic moment, is parallel and in the same direction as the direction X. Typically, the amplitude of the magnetization at saturation of the layer 42 is greater than or equal to 400000 A/m or 800000 A/m or even 1600000 A/m.

This direction of magnetization is trapped by an exchange coupling with the layers 40 and 44. An exchange coupling between a ferromagnetic layer and an antiferromagnetic layer appears if:
the ferromagnetic layer is deposited directly on the antiferromagnetic layer, or
only separated from the antiferromagnetic layer by one (or more) very fine non-magnetic layer(s) whose total thickness is less than 0.5 nm and preferably less than 0.4 nm or 0.2 nm.

The exchange coupling between the ferromagnetic and antiferromagnetic layers is well known. For example, the reader may refer to the following article: J. Nogués and Ivan K. Schuller, "*Exchange bias*", Journal of magnetism and magnetic materials 192 (1999), 203-232.

In this embodiment, each exchange coupling is obtained by directly depositing the ferromagnetic layer on the antiferromagnetic layer.

Figure 1:
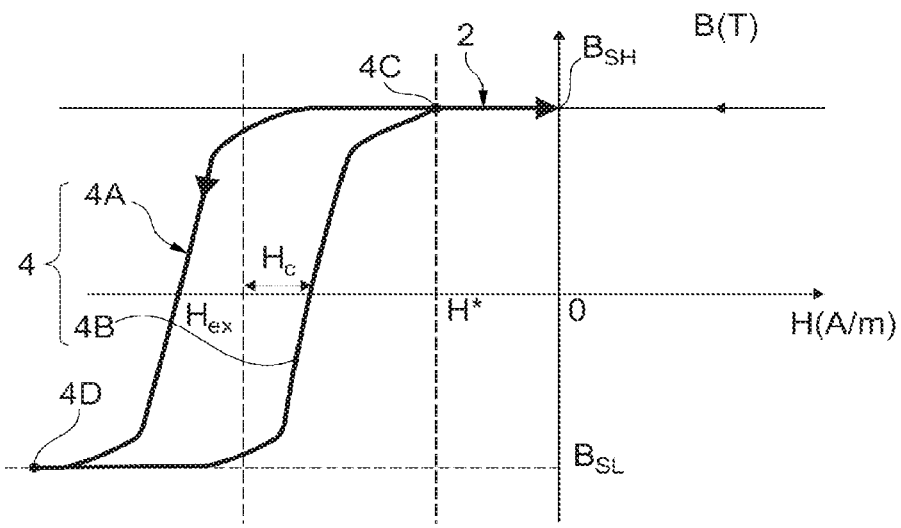

The presence of the exchange coupling between the ferromagnetic layer and the antiferromagnetic layer translates in particular into an offset, for example to the left as illustrated in FIG. 1, of the hysteresis cycle of the assemblage of these two layers and thus the appearance of a field $H_{ex}$ which is not zero.

Here, the thicknesses of the layers 40 and 42 are chosen to obtain a good exchange coupling between these two layers. In this description, it shall be considered that the exchange coupling is good if this translates into the appearance of an exchange field $H_{ex}$ whose absolute value is greater than 4000 A/m and preferably greater than 8000 A/m or 16000 A/m) or 40000 A/m at 25° C. The fields $H_{ex}$ and $H_c$ of a stack containing only the layers 40 and 42 can be measured experimentally or obtained by numerical simulation.

A good exchange coupling in the case of a significant outside magnetic perturbation makes it possible to return to the initial state after the disappearance of this perturbation.

The thickness of the layers 40 and 42 is determined, for example, by experimentation consecutively testing out different thicknesses for a stack formed solely by one antiferromagnetic layer and one ferromagnetic layer realized in the same materials as the layers 40 and 42. For the most common antiferromagnetic and ferromagnetic materials, the appropriate thicknesses are known to the person skilled in the art. For example, typically the thickness of the layer 40 is between 5 nm and 100 nm and preferably between 5 nm and 25 nm. The thickness of the layer 42 is often between 0.5 nm and 50 nm or 100 nm. Preferably, the thickness of the layer 42 is greater than 10 nm. In this example, the thickness of the layer 40 is between $e_{FM}/3$ and $3e_{FM}$ in order to obtain a good exchange coupling, where $e_{FM}$ is the thickness of the layer 42. Here, the thickness of the layer 40 is 7 nm while the thickness of the layer 42 is 21 nm.

The thickness of the layer 44 is chosen so as to obtain a good exchange coupling with the layers 42 and 46. Consequently, the layer 44 may, if necessary, be thicker than the layers 42 and 46. In this example, the thicknesses of the layers 44 and 48 are identical to the thickness of the layer 40.

The overall magnetic moment of the permanent magnet 20 is proportional to the sum of the magnetic moments of all the layers 42 and 46 of the stack.

Here, to improve the field H*, the layer 42 comprises a sublayer 50 of CoFeB, and a sublayer 52 realized in a ferromagnetic material different from CoFeB.

In this description, the composition of a layer or a sublayer is denoted as follows: $A_xB_y$, where:
A and B are the symbols of the chemical elements making up this layer or sublayer, and
the index x is the mass of element A in the layer or sublayer, expressed as a percentage of the mass of that layer or sublayer, and
the index y is the mass of element B in the layer or sublayer, expressed as a percentage of the mass of that layer or sublayer.

Here, the composition of the sublayer 50 is denoted $Co_xFe_yB_z$. Preferably, the composition of the sublayer 50 is such that z is between 10% and 30% in atomic mass. Advantageously one will likewise select x and y to be each greater than or equal to 10%.

For example, the composition of the sublayer 50 is as follows: $Co_{28}Fe_{52}B_{20}$ or $Co_{40}Fe_{40}B_{20}$ or $Co_{43}Fe_{43}B_{14}$.

The thickness of the sublayer 50 is greater than 0.05 nm or 0.1 nm and preferably greater than 0.5 nm. Preferably, the maximum thickness of the sublayer 50 is less than 10 nm and advantageously less than 5 nm or 2 nm.

In this embodiment, the sublayer 50 is deposited directly on the layer 40.

The sublayer 52 is, for example, realized in a ferromagnetic material chosen from the group made up of cobalt, nickel, iron and their alloys. For example, the ferromagnetic material is often CoFe or NiFe. Here, the sublayer 52 is realized in CoFe. The composition of the sublayer 52 is denoted $Co_aFe_b$. The percentages a, b of cobalt and iron in the sublayer 52 are different from the percentages x, y of these same elements in the sublayer 50. For example, the sublayer 52 is realized in $Co_{35}Fe_{65}$ or in $Co_{80}Fe_{20}$.

The thickness $e_{52}$ of the sublayer 52 is strictly greater than the thickness $e_{50}$ of the sublayer 50. Typically, the thickness $e_{52}$ is at least two or five or ten or twenty times greater than the thickness $e_{50}$.

The pattern $34_1$ starts and ends with an antiferromagnetic layer. Thanks to this, each occurrence $36_2$ to $36_N$ of the growth layer 36 is systematically and directly interposed between the top antiferromagnetic layer 48 of the previous pattern and the bottom ferromagnetic layer 40 of the following pattern.

In this embodiment, the different occurrences of the pattern 36 are all identical to each other and only the occurrence $36_2$ shall thus be described in detail.

The growth layer $36_2$ is entirely realized in non-magnetic material. In this embodiment, it is formed by a stack of two sublayers 54, 56 of non-magnetic material deposited directly one on the other in the direction Z. At least one of these sublayers is entirely made of a material chosen from the group made up of the following metals: Ta, Cu, Ru, V, Mo, Hf, Mg, NiCr and NiFeCr. The alloys NiCr and NiFeCr are non-magnetic at room temperature if chromium is present in sufficient quantity. Typically, the composition of these alloys is $Ni_{1-x}Cr_x$ and $[NiFe]_{1-x}Cr_x$, where x is greater than 0.2 or 0.35 and preferably lies between 0.35 and 0.5.

In the following, a sublayer realized in one of the materials of this group is called the "metallic sublayer". Preferably, the metallic sublayer is the one which is in direct contact with the layer 40 of the following pattern in the direction Z. Here, it is thus the sublayer 56 which is the metallic sublayer. Typically, the thickness of the metallic sublayer is greater than 0.5 nm or 1 nm.

Here, the sublayer 54 is also a metallic sublayer realized in a metal different from the sublayer 56.

Typically, the material or materials of the layer 36 are chosen to be adapted to the bottom antiferromagnetic layer 40 of the following pattern $34_2$ from among the materials of the proposed group. For example, if the antiferromagnetic material of the layer 40 is PtMn, at least one of the sublayers of the layer 36 is realized in tantalum (Ta) or in $[Ni_{1-y}Fe_y]_{1-x}Cr_x$. In this latter case, preferably the mass percentage x of chromium in the sublayer of NiFeCr is between 35% and 45%. Preferably, the mass percentage y is between 15% and 25%. For example, the mass percentage y is equal to 20%.

If the layer 40 is made of IrMn, one will prefer a layer 36 formed of a sublayer of tantalum (Ta) and a sublayer of copper (Cu) or a sublayer of tantalum and a sublayer of ruthenium (Ru).

If the antiferromagnetic material of the layer 56 contains manganese (Mn), advantageously the growth layer 36 comprises at least one sublayer of tantalum (Ta). Tantalum has the advantage of forming a diffusion barrier which prevents the atoms of manganese of the layer 40 from diffusing through the layer $36_2$ during the fabrication of the magnet 20 and especially during the steps of fabrication where the antiferromagnetic layers are heated to more than 350° C. or 400° C.

In this embodiment, the sublayer 56 is realized in copper and its thickness is 2 nm and the sublayer 54 is a sublayer of tantalum of 5 nm.

The thickness $e_{36}$ of the layer $36_2$ is greater than 0.5 nm or 1 nm. It has been observed experimentally that a relation exists between the thickness $e_{36}$ and the field H* of the magnet 20. More precisely, this relation may be divided into two parts:

a first part extending from 0.5 nm or 1 nm to a critical thickness $ec_{36}$ in which the greater the thickness $e_{36}$ the more the field H* moves away from the ordinate axis, then a second part extending beyond the critical thickness $ec_{36}$ in which the increasing thickness $e_{36}$ no longer moves the field H* away from the ordinate axis, or does so very slightly.

Thus, preferably the thickness $e_{36}$ is chosen to be less than or equal to the critical thickness $ec_{36}$. This critical thickness $ec_{36}$ depends on the materials used to realize the layer $36_2$. In practice, this critical thickness $ec_{36}$ is determined experimentally by testing out various possible thicknesses $e_{36}$ for the layer $36_2$ and measuring the field H* obtained for that thickness $e_{36}$. It is then possible to construct the relation between the thickness $e_{36}$ and the field H*. After this, one determines the two line segments constituting the best approximation of this relation. The first segment extends between the coordinates (x1; y1) and (x2; y2) and the second segment extends between the coordinates (x2; y2) et (x3; y3). Typically, x1=1 nm, x2=$ec_{36}$ and x3=+∞. The determination of the segments thus consists in determining the values of the unknowns y1, x2, y2, y3 which minimize, in the sense of least squares, the differences between these two segments and the relation measured by experiment. The critical thickness $ec_{36}$ is equal to the abscissa x2. Generally, this leads to a choice of a thickness $e_{36}$ less than 10 nm or 5 nm.

Figures 4, 5:
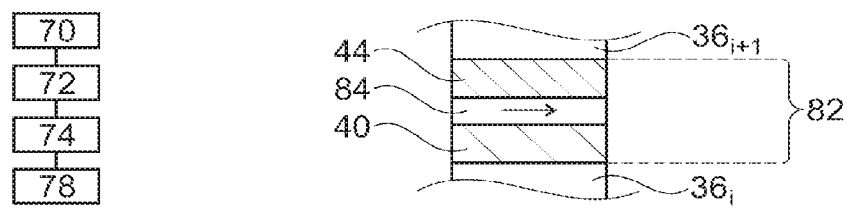
FIG. 4 is a flow chart of a method for fabrication of the permanent magnet of FIG. 3.
FIGS. 5 and 6 are schematic illustrations, in vertical longitudinal section, of other possible embodiments of a pattern of the permanent magnet of FIG. 3.

FIG. 4 represents a method of fabrication of the permanent magnet 20. More precisely, during a step 70 the different layers described in reference to FIG. 3 are deposited one after another. For this, one uses known methods in the field of microtechnologies and the realization of electronic chips. During step 70, no particular form is given to this stack of layers. This stack covers at least the locations where the magnets 20 to 22 need to be realized.

During a step 72, this stack is structured so that only stacks in the form of a bar remain in the locations where the magnets 20 to 22 need to be realized. Thus, at the end of this step, only bars having the required form factors remain, that is, generally greater than 2, 10 or 100 or even greater than 100 or 1000.

Next, during a step 74, the bars are heated so that the temperature of the antiferromagnetic layers passes their ordering temperature. This annealing is done under a saturating magnetic field as described for example in the application US 2011/0151589. During this step, the temperature may surpass 250° C., 350° C. or 400° C.

Next, as described for example in the application US 2011/0151589, during a step 78 the bars are cooled under a weaker field until the exchange couplings between the ferromagnetic and antiferromagnetic layers appear and trap the directions of magnetization of each ferromagnetic layer. One thus obtains the permanent magnets 20 to 22.

For the other steps in the fabrication of the sensor 10, the reader may refer to the patent applications previously cited in the introduction.

Various experiments have been carried out to confirm that the introduction of the growth layer 36 within the stack of antiferromagnetic and ferromagnetic layers made it possible to improve the field H*. The following table summarizes the experimental results obtained.

| Magnet No. | $B_R$ (nWb) | $H_{ex}$ (Oe) | $H_c$ (Oe) | $H_{ex}/H_c$ | $H_{ex}$-$H_c$ | "squareness" | H* (Oe) |
|---|---|---|---|---|---|---|---|
| 1 | 138.3 | 124.6 | 41.3 | 3.07 | 83.3 | 0.9415 | 44 |
| 2 | 193.4 | 144.4 | 23.85 | 6.05 | 120.55 | 0.9962 | 108 |
| 3 | 74.13 | 175.4 | 48.97 | 3.58 | 126.43 | 0.955 | 57 |
| 4 | 73.63 | 191.1 | 44.14 | 4.33 | 146.96 | 0.959 | 86 |
| 5 | 73.01 | 206.9 | 206.9 | 5.23 | 167.36 | 0.967 | 119 |

In the above table, the first column contains the number of the magnet on which the measurements were taken. Here, each magnet was realized by implementing the method of FIG. 4 with the exception of step 72. Thus, the magnets tested are not structured and thus do not extend in a particular direction.

For each magnet number, the composition of each layer/sublayer starting from layer $36_1$ and going as far as layer 38 is given below. In the following lines, the composition of a layer is separated from the composition of the layers immediately preceding and following it in the stack by the symbol "/". The symbol [ . . . ]*M indicates that the stack of layers and sublayers present between the brackets is repeated M times. The number which is separated from the composition of the layer by a space expresses the thickness of that layer in nanometres.

Magnet No. 1: Ta 5/Ru 3/[$Ir_{20}Mn_{80}$ 10/$Co_{43}Fe_{43}B_{14}$ 1/$Fe_{65}Co_{35}$ 19/$Ir_{20}Mn_{80}$ 10/$Co_{43}Fe_{43}B_{14}$ 1/$Fe_{65}Co_{35}$ 19/$Ir_{20}Mn_{80}$ 10]*12/$Ir_{20}Mn_{80}$ 10/Ta 10.

Magnet No. 2: [Ta 5/Cu 2/$Ir_{20}Mn_{80}$ 7/$Co_{43}Fe_{43}B_{14}$ 1/$Fe_{65}Co_{35}$ 20/$Ir_{20}Mn_{80}$ 7/$Co_{43}Fe_{43}B_{14}$ 1/$Fe_{65}Co_{35}$ 20/$Ir_{20}Mn_{80}$ 7]*8/Ta 10.

Magnet No. 3: Ta 5/Ru 3/$Ir_{20}Mn_{80}$ 7/[$Co_{43}Fe_{43}B_{14}$ 1/$Fe_{65}Co_{35}$ 15/$Ir_{20}Mn_{80}$ 7]*8/Ta 10.

Magnet No. 4: [Ta 5/Ru 3/$Ir_{20}Mn_{80}$ 7/$Co_{43}Fe_{43}B_{14}$ 1/$Fe_{65}Co_{35}$ 15/$Ir_{20}Mn_{80}$ 7/$Co_{43}Fe_{43}B_{14}$ 1/$Fe_{65}Co_{35}$ 15/$Ir_{20}Mn_{80}$ 7/$Co_{43}Fe_{43}B_{14}$ 1/$Fe_{65}Co_{35}$ 15/$Ir_{20}Mn_{80}$ 7]*2/Ta 10.

Magnet No. 5: [Ta 5/Ru 3/$Ir_{20}Mn_{80}$ 7/$Co_{43}Fe_{43}B_{14}$ 1/$Fe_{65}Co_{35}$ 15/$Ir_{20}Mn_{80}$ 7]*4/Ta 10.

Magnets No. 1 and 3 correspond to magnets of the prior art lacking an intermediate layer situated between two antiferromagnetic layers. Magnet No. 2 corresponds to the magnet described in reference to FIG. 3 in the case where the number N of patterns 34 is equal to eight. Magnets No. 4 and 5 are identical to magnet No. 3 except that one and three growth layers, respectively, are introduced into the stack.

The field $B_R$ of the table corresponds to the magnetic flux measured in a zero field. It is expressed in nano-Weber (nWb). As a reminder, 1 Wb=1 Tm². The fields $H_{ex}$, $H_c$ and H* of the table are expressed in Oersted (Oe). As a reminder, 1 Oe=1000/(4π) A·m$^{-1}$. Also keep in mind that the field H* corresponds to the magnetic field for which the hysteresis is less than 2% of the value of $B_R$. The "Squareness" column contains a value which is higher as the hysteresis cycle of the magnet is closer to a rectangle. This value is calculated with the aid of the following formula: Squareness=(1−($B_R$/(SlopeAtH$_c$*H$_c$))), where SlopeAtH$_c$ is the slope of the curve of the magnetization B as a function of the field H in the area of the abscissa point $H_{ex}$−$H_c$.

The various measurements indicated in the table have been obtained with the aid of a measurement apparatus known by the term "BH-Looper". Here, it involves the apparatus MESA-200 marketed by the company SHB instruments.

As shown by the measurements indicated in the table, for a nearly identical quantity of ferromagnetic materials the introduction of the growth layer 36 between the antiferromagnetic layer 48 of the preceding pattern 34 and the antiferromagnetic layer 40 of the following pattern 34 is able to improve the field H* as compared to an almost identical magnet (magnet No. 1 or 3), yet lacking the layers 36. Moreover, the presence of the layer 36 also allows an increasing of the ratio $H_{ex}/H_c$. Thus, the permanent magnet 20 has increased insensitivity to outside magnetic perturbations since the field H* is further away from the ordinate axis. This improves the dynamics of the sensor incorporating this permanent magnet since the hysteresis cycle of the magnet is more square.

Finally, increasing the ratio $H_{ex}/H_c$ is likewise useful for fabricating the magnet 20 with the shape of a slender bar. In fact, it is known that the shaping of the permanent magnet as a slender bar having a significant form factor increases the value of the field $H_c$ whereas the field $H_{ex}$ remains constant. Thus, if prior to a shaping the ratio $H_{ex}/H_c$ is not sizeable enough, after the shaping the field H* is very close to zero or greater than zero, so that this magnetized bar is then very sensitive to outside magnetic perturbations.

FIG. 5 represents a pattern 82 able to replace the pattern 34 in the magnet 20. The pattern 82 is identical to the pattern 34 except that:

the layers 46 and 48 are omitted, and
the ferromagnetic layer 42 is replaced by a ferromagnetic layer 84. The layer 84 is identical to the layer 42 except that the sublayer 50 is omitted.

Figure 6:
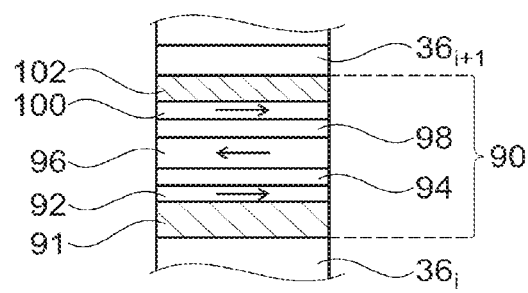

FIG. 6 shows a pattern 90 able to replace the pattern 34 in the magnet 20. The pattern 90 is composed successively in the direction Z:

of an antiferromagnetic layer 91,
of a ferromagnetic layer 92 whose direction of magnetization is trapped by exchange coupling with the antiferromagnetic layer 91,
of a non-magnetic layer 94 known as a "spacer",
of a ferromagnetic layer 96 whose direction of magnetization is trapped by antiferromagnetic RKKY (Ruderman-Kittel-Kasuya-Yosida) coupling with the ferromagnetic layer 92,
of a non-magnetic layer 98 forming a spacer,
of a ferromagnetic layer 100 which traps, by antiferromagnetic RKKY coupling, the direction of magnetization of the layer 96, and
of an antiferromagnetic layer 102 which traps the direction of magnetization of the ferromagnetic layer 100 by exchange coupling.

The layer 102 for example is identical to the layer 91. This pattern 100 is identical to the one in FIG. 3 of the application FR3020497 except that it further comprises the antiferromagnetic layer 102 situated on top of the ferromagnetic layer 100. For further details on the structure and the functioning of this pattern, the reader should consult that application FR3020497.

Thanks to the adding of the layer 102 in the pattern 100, the occurrences $36_2$ to $36_N$ of the growth layer 36 are each directly interposed between the antiferromagnetic layer 102 of the preceding pattern 90 and the antiferromagnetic layer 91 of the following pattern 90. Thus, as in the previous embodiments, this improves the field H*.

Variants of the Patterns:

There are many other embodiments which are possible for the patterns. For example, the following structures of magnets have an improved field H* as compared to the same structures yet lacking growth layers:

1) [Ta3/Cu1/IrMn 7/FeCo 20/IrMn 7]*10/Ta 10
2) [Ta5/Cu2/IrMn 7/FeCo 20/IrMn 7/FeCo 20/IrMn 7]*5/Ta 10
3) [Ta5/Ru3/IrMn 7/FeCo 20/IrMn 7/FeCo 20/IrMn 7]*5/Ta 10
4) Ta 5/Ru 3/IrMn 7/FeCo 20/IrMn 7/[Ta3/Cu1/IrMn 7/FeCo 20/IrMn 7/FeCo 20/IrMn 7]*4/Ta 10
5) [Ta5/PtMn 20/CoFeB 1/CoFe 9]*20/PtMn 20/Ta 10.

The above structures are described using the same notations as previously introduced. Moreover, to show the growth layer in these structures, the components which form it are underlined. In the case of the above structure 4), the initial layers "Ta 5" and "Ru 3" are a bonding layer and a seed layer, respectively.

The pattern may comprise even more ferromagnetic and antiferromagnetic layers stacked on one another than the pattern 34. As an illustration, a pattern which may be used in place of the pattern 34 may comprise in addition to the layers 40, 42, 44, 46 and 48:

- a supplemental ferromagnetic layer deposited on the layer 48 and whose direction of magnetization is frozen, by exchange coupling with the layer 48, and
- a supplemental antiferromagnetic layer deposited on the supplemental ferromagnetic layer which likewise freezes the direction of magnetization of this supplemental ferromagnetic layer by exchange coupling.

It is possible to combine different patterns in the same stack. For example, it is possible to construct a stack by alternating patterns 34 and 82 or patterns 34, 82 and 90.

The ferromagnetic material used to form the ferromagnetic layer 42, 46, 84, 92, 96 or 100 may be different from one pattern to another in the stack. For example, the stack comprises, in alternation, the patterns 82 and another pattern identical to the pattern 82 except that the ferromagnetic material of the layer 84 is NiFe, whereas in the pattern 82 it is CoFe.

In similar fashion, the antiferromagnetic material used to form the layer 40, 44, 48, 91, 102 of a pattern may be different from one pattern to another. For example, in one pattern this antiferromagnetic material is IrMn and in another pattern it is PtMn.

The introduction of a growth layer between consecutive patterns may be done with all the patterns described in the application FR3020497. For this, as described here in the particular case of FIG. 6, it is enough to add to the top of each of the patterns of application FR3020497 a supplemental antiferromagnetic layer so that each of these patterns starts and ends with an antiferromagnetic layer.

Variants of the Ferromagnetic Layer:

The sublayer 50 is not necessarily situated in the area of the interface with the antiferromagnetic layer. For example, the ferromagnetic layer 42 comprises three ferromagnetic sublayers stacked directly on one another and the sublayer 50 is placed in the middle of this stack of three ferromagnetic sublayers.

All the ferromagnetic layers of all the embodiments described here may be realized as the layer 42, that is, by a stack of the sublayer 50 with another ferromagnetic sublayer. On the other hand, the sublayer 50 may be omitted or replaced by a sublayer of a different ferromagnetic material in all the embodiments described here. In another variant, it is the sublayer 52 which is omitted. In this case, the layer 42 is entirely realized in CoFeB. The thickness of the layer 42 made of CoFeB is then generally greater than 5 nm or 10 nm.

The ferromagnetic layers are not necessarily each formed by a single homogeneous block of ferromagnetic material. For example, each ferromagnetic layer may also be laminated, as described in the patent application FR 2 892 871 in the passage on page 13, lines 5 to 9.

Variants of the Antiferromagnetic Layer:

The antiferromagnetic layers may also each be formed by a stack of several antiferromagnetic sublayers. For example, the antiferromagnetic layer 40, 44 or 48 is formed by a sublayer of IrMn deposited directly on a sublayer of PtMn.

Variants of the Growth Layer:

The occurrence $36_1$ of the growth layer 36 may be omitted. It may also be replaced by another seed layer or by a bonding layer ("buffer layer") or by a combination of a seed layer deposited on a bonding layer deposited directly on the base 30. The seed layer may be, for example, a layer of non-magnetic material used to facilitate the depositing, for example, by epitaxial growth, of the layer 40. The seed layer is for example a layer of ruthenium, with thickness of 3 nm. The bonding layer is for example a layer of tantalum with a thickness of 5 nm. The bonding layer is deposited directly on the base 30. Other variants are of course possible and in particular a single layer serving as both seed layer and buffer layer.

Many other embodiments of the growth layer are possible. For example, the sublayer 54 may be omitted. In this case, the growth layer 36 comprises a single metallic layer realized entirely with a single metal or an alloy of metals, this metal or each of the metals of the alloy being chosen from the group made up of the following metals: Ta, Cu, Ru, V, Mo, Hf, Mg, NiCr and NiFeCr. For example, the layer 36 is realized entirely and solely in tantalum. In this latter case, the antiferromagnetic layer directly deposited on this layer 36 is advantageously made of PtMn.

The metallic sublayer 56 is not necessarily in direct contact with the antiferromagnetic layer of the following pattern. For example, as a variant, the order of the sublayers 54 and 56 is reversed.

Likewise, the number of sublayers used to form the layer 36 may be greater than three or four. In this case, in one advantageous embodiment, the sublayers which are in direct contact with the layer 48 of the preceding pattern and the layer 40 of the following pattern, respectively, are metallic sublayers. Between these two metallic sublayers, one or more intermediate sublayers are realized in oxide or in nitride. Preferably, when the sublayer is realized in oxide, the latter is chosen from the group made up of the following elements: $SiO_2$, $TiO_2$ and $Al_2O_3$. Preferably, when the sublayer is realized in nitride, the latter is chosen from the group made up of the following elements: SiN, CuN, TiN and TaN.

The sublayer 54 may also be realized in oxide or in nitride.

The different exemplars of the growth layer introduced into the stack are not necessarily all identical. For example, the growth layer $36_3$ of the magnet 20 is replaced by a growth layer different from the growth layer $36_2$. For example, this different growth layer is identical to the layer $36_2$ except that the sublayer 54 is replaced by a sublayer of $SiO_2$.

In one simplified embodiment, the growth layer is not systematically introduced between all the consecutive patterns. However, a growth layer is introduced at least once every P consecutive patterns, or every 2P consecutive ferromagnetic layers. In this reckoning, only the ferromagnetic layers whose directions of magnetization are trapped by exchange coupling with an antiferromagnetic layer are counted. Thus, in this reckoning, a ferromagnetic layer such as the layer 96 is not counted. P is less than or equal to ten, and preferably less than or equal to four or two. Thus, at least a tenth, and preferably at least a quarter or at least half of the patterns are separated from the immediately following pattern by a growth layer. Furthermore, the consecutive patterns which are not separated from each other by a growth layer are stacked directly on one another.

Other Variants:

The stack does not necessarily have the form of a parallelepiped. For example, the cross section of the stack parallel to the directions X, Y is an ellipse or an oval. In the latter cases, the form factor of the permanent magnet is defined as being the ratio between the length and the width of the parallelepiped of smallest volume which entirely contains the stack.

As a variant, the form factor of the stack is not necessarily greater than or equal to two. For example, it may be equal to one.

The invention claimed is:

1. A permanent magnet comprising a stack of N patterns stacked one on top of another in a stack direction, wherein N is a whole number greater than or equal to two, wherein each pattern comprises:
   a bottom antiferromagnetic layer,
   a top antiferromagnetic layer, and
   a ferromagnetic layer situated between the bottom and top antiferromagnetic layers and whose direction of magnetization is frozen, by an exchange coupling, with the bottom or top antiferromagnetic layer of said pattern,
   the directions of magnetization of the ferromagnetic layers which are coupled by exchange coupling with the bottom or top antiferromagnetic layer of the same pattern are identical to each other,
   wherein:
   at least once per group of ten consecutive ferromagnetic layers whose directions of magnetization are frozen by exchange coupling, the stack comprises a growth layer interposed between the top antiferromagnetic layer of the previous pattern and the bottom antiferromagnetic layer of the following pattern in the stack direction and said growth layer is directly in contact with said two top and bottom antiferromagnetic layers between which the growth layer is interposed,
   the growth layer comprises a nonmagnetic material selected from the group consisting of Ta, Cu, Ru, V, Mo, Hf, Mg, NiCr and NiFeCr, or the growth layer comprises a stack of several sublayers, each comprising a nonmagnetic material, disposed immediately on one another in the stack direction, wherein at least one of the several sublayers is a metallic sublayer comprising a nonmagnetic material selected from the group consisting of Ta, Cu, Ru, V, Mo, Hf, Mg, NiCr and NiFeCr, and
   a thickness of the growth layer is greater than 0.5 nm.

2. The magnet according to claim 1, wherein the top and bottom antiferromagnetic layers that are directly in contact with the growth layer and between which the growth layer is interposed comprise manganese and the growth layer comprises tantalum.

3. The magnet according to claim 1, wherein the growth layer comprises the stack of the several sublayers and the metallic sublayer is directly in contact with at least one of the antiferromagnetic layers of the next pattern in the stack direction.

4. The magnet according to claim 3, wherein at least one of the several sublayers of the stack comprises an oxide or nitride.

5. The magnet according to claim 1, wherein the number N is greater than or equal to five.

6. The magnet according to claim 1, wherein the stack of the N patterns comprises a growth layer interposed between two consecutive patterns of the stack of the N patterns at least once per group of four consecutive ferromagnetic layers whose directions of magnetization are frozen by exchange coupling.

7. The magnet according to claim 6, wherein the stack of the N patterns comprises a growth layer interposed between each pattern.

8. The magnet according to claim 1, wherein the direction of magnetization of the ferromagnetic layer is frozen, by an exchange coupling with the bottom and top antiferromagnetic layers of said pattern.

9. The magnet according to claim 1, wherein at least one of the N patterns comprises an additional ferromagnetic layer whose direction of magnetization is trapped solely by Ruderman-Kittel-Kasuva-Yosida (RKKY) coupling with the ferromagnetic layer.

10. The magnet according to claim 1, wherein at least one of the ferromagnetic layers comprises:
    a first sublayer in comprising CoFeB and having a thickness of greater than 0.05 nm, and
    a second sublayer comprising a ferromagnetic material different from CoFeB and having a thickness of greater than the thickness of the first sublayer.

11. A magnetic field sensor comprising:
    a substrate extending substantially in a plane,
    at least one permanent magnet movable in relation to the substrate in response to a variation in an amplitude or a direction of a magnetic field to be measured,
    a transducer secured to the substrate and able to convert a movement of the at least one permanent magnet into an electrical quantity representative of the amplitude or the direction of the magnetic field to be measured,
    wherein the at least one permanent magnet is a permanent magnet according to claim 1.

12. A method of fabrication of a permanent magnet, the method comprising:
    a) forming a stack comprising N patterns stacked one upon the other in a stack direction, where N is a whole number greater than or equal to two, each pattern comprising:
       a bottom antiferromagnetic layer,
       a top antiferromagnetic layer, and
       a ferromagnetic layer situated between the bottom and top antiferromagnetic layers,
    b) heating the stack so as to achieve a temperature greater than a temperature of ordering of the material of the magnetic layers of the stack,
    c) when the temperature is greater than the temperature of the ordering, applying a first magnetic field to align the direction of magnetization of the ferromagnetic layers with a predetermined desired direction,
    d) cooling the stack in the presence of a second magnetic field less than the first magnetic field to cause an exchange coupling to appear between the ferromagnetic layer and the bottom or top antiferromagnetic layer of said pattern of the stack,
    wherein a) comprises forming, at least once per group of ten consecutive ferromagnetic layers whose directions of magnetization are frozen by exchange coupling, a growth layer interposed between the top antiferromagnetic layer of the previous pattern and the bottom antiferromagnetic layer of the following pattern in the stack direction, said growth layer is directly in contact with said two top and bottom antiferromagnetic layers between which the growth layer is interposed, said growth layer comprises a nonmagnetic material selected from the group consisting of Ta, Cu, Ru, Mo, Hf, Mg, NiCr and NiFeCr, or the growth layer comprises a stack of several sublayers of a nonmagnetic material disposed immediately on one another in the stack direction, wherein at least one of the several sublayers is a metallic sublayer comprising a nonmagnetic material selected from the group consisting of Ta, Cu, Ru, V, Mo, Hf, Mg, NiCr and NiFeCr, and a thickness of the growth layer is greater than 0.5 nm.

* * * * *